(12) United States Patent
Fukuda

(10) Patent No.: US 10,629,407 B2
(45) Date of Patent: Apr. 21, 2020

(54) CHARGED PARTICLE BEAM DEVICE

(71) Applicant: JEOL Ltd., Tokyo (JP)

(72) Inventor: Tomohisa Fukuda, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/183,952

(22) Filed: Nov. 8, 2018

(65) Prior Publication Data
US 2019/0148106 A1 May 16, 2019

(30) Foreign Application Priority Data
Nov. 13, 2017 (JP) .................................. 2017-218154

(51) Int. Cl.
| | | |
|---|---|---|
| H01J 37/28 | (2006.01) | |
| H01J 37/244 | (2006.01) | |
| G01N 23/04 | (2018.01) | |
| G01N 23/20 | (2018.01) | |
| H01J 37/147 | (2006.01) | |
| H01J 37/295 | (2006.01) | |

(52) U.S. Cl.
CPC ............ *H01J 37/244* (2013.01); *G01N 23/04* (2013.01); *G01N 23/20* (2013.01); *H01J 37/147* (2013.01); *H01J 37/28* (2013.01); *H01J 37/295* (2013.01); *H01J 2237/002* (2013.01); *H01J 2237/24455* (2013.01); *H01J 2237/2802* (2013.01)

(58) Field of Classification Search
CPC ........ H01J 37/244; H01J 37/147; H01J 37/28; H01J 37/295; H01J 2237/002; H01J 2237/24455; H01J 2237/2802; G01N 23/04; G01N 23/20
USPC ............. 250/306, 307, 309, 310, 311, 492.1, 250/492.2, 492.3
See application file for complete search history.

(56) References Cited

U.S. PATENT DOCUMENTS

2014/0284477 A1* 9/2014 Ebine .................... H01J 37/252 250/310

FOREIGN PATENT DOCUMENTS

JP 2005235665 A 2/2005

* cited by examiner

*Primary Examiner* — Nicole M Ippolito
(74) *Attorney, Agent, or Firm* — The Webb Law Firm

(57) ABSTRACT

A charged particle beam device includes: a detection chamber flange; a detector; a detector holding stand which holds the detector; a first shaft which is slidably inserted into a guide hole and connected to the detector holding stand, the guide hole being provided in the detection chamber flange; a first flange which is attached to the detection chamber flange and has a spherical bearing; a second flange which is supported by the spherical bearing of the first flange; and a second shaft which is slidably inserted into a guide hole provided in the second flange and passes through a through-hole in the detection chamber flange to be connected to the detector holding stand, each of the first shaft and the second shaft being provided with a flow channel of a heat transfer medium for cooling or heating the detector.

4 Claims, 7 Drawing Sheets

CHARGED PARTICLE BEAM DEVICE

CROSS-REFERENCE TO RELATED APPLICATION

This application claims priority to Japanese Patent Application No. 2017-218154 filed Nov. 13, 2017, the disclosure of which is hereby incorporated in its entirety by reference.

Japanese Patent Application No. 2017-218154, filed on Nov. 13, 2017, is hereby incorporated by reference in its entirety.

BACKGROUND OF THE INVENTION

Field of the Invention

The present invention relates to a charged particle beam device.

Description of Related Art

In charged particle beam devices such as a transmission electron microscope and a scanning transmission electron microscope, various detectors are used in accordance with observation methods and analysis methods. Therefore, in a charged particle beam device, various detectors are arranged on an optical axis. For example, an annular dark-field detector (an ADF detector), a fluorescent screen, a detecting unit of an energy filter, and the like are arranged on an optical axis (refer to JP-A-2005-235665).

In recent years, pixelated STEM detectors which are high-speed image sensors capable of two-dimensionally detecting an electron beam and acquiring a two-dimensional image and also capable of tracking scanning of the electron beam are drawing attention as detectors to be mounted to a scanning transmission electron microscope. With an electron microscope mounted with a pixelated STEM detector, since an electron diffraction pattern can be recorded without modification as a two-dimensional image, a displacement between a transmitted wave disk and an optical axis or a shape of the transmitted wave disk can be confirmed as an image. The pixelated STEM detector is provided on the optical axis in a similar manner to the detectors described above.

With the pixelated STEM detector, cooling water is supplied in order to reduce noise caused by heat. Therefore, a shaft for introducing cooling water and a shaft for leading out cooling water are connected to a holding stand for holding the pixelated STEM detector, and the holding stand is supported by the two shafts. In addition, since the pixelated STEM detector moves between a detection position and a retracted position, O rings are used to create a seal between the shafts and guide holes of a flange into which the shafts are inserted. Using 0 rings enables leakage (a vacuum leakage) of a detection chamber to be prevented and, at the same time, makes the shafts slidable in the guide holes.

When the two shafts are ideally formed, since coaxiality between each shaft and the guide hole of the flange corresponding to the shaft is secured, the O ring is not subjected to an excessive load when the shaft slides.

However, in reality, parts contain manufacturing error. Therefore, for example, when one of the shafts is considered a reference, manufacturing error may prevent coaxiality from being secured between the other shaft and the corresponding guide hole. In this case, a load applied to the O ring that provides a seal between the shaft and the guide hole may create a state where vacuum sealing cannot be achieved and may prevent airtightness of the detection chamber from being secured.

SUMMARY OF THE INVENTION

The invention can provide a charged particle beam device capable of absorbing manufacturing error.

According to a first aspect of the invention, there is provided a charged particle beam device including:
 a detection chamber flange which airtightly seals a detection chamber;
 a detector which is provided in the detection chamber;
 a detector holding stand which holds the detector;
 a first shaft which is slidably inserted into a guide hole and connected to the detector holding stand, the guide hole being provided in the detection chamber flange;
 a first flange which is attached to the detection chamber flange and has a spherical bearing;
 a second flange which is supported by the spherical bearing of the first flange; and
 a second shaft which is slidably inserted into a guide hole provided in the second flange and passes through a through-hole in the detection chamber flange to be connected to the detector holding stand,
 each of the first shaft and the second shaft being provided with a flow channel of a heat transfer medium for cooling or heating the detector.

According to a second aspect of the invention, there is provided a charged particle beam device including:
 a detection chamber flange which airtightly seals a detection chamber;
 a detector which is provided in the detection chamber;
 a detector holding stand which holds the detector;
 a first shaft which is slidably inserted into a guide hole and connected to the detector holding stand, the guide hole being provided in the detection chamber flange;
 a linear motion shaft which has a spherical tip section;
 a drive unit which linearly moves the linear motion shaft; and
 a shaft supporting member which is connected to the detector holding stand and has a spherical bearing for receiving the tip section of the linear motion shaft.

DESCRIPTION OF THE INVENTION

Figure 1:
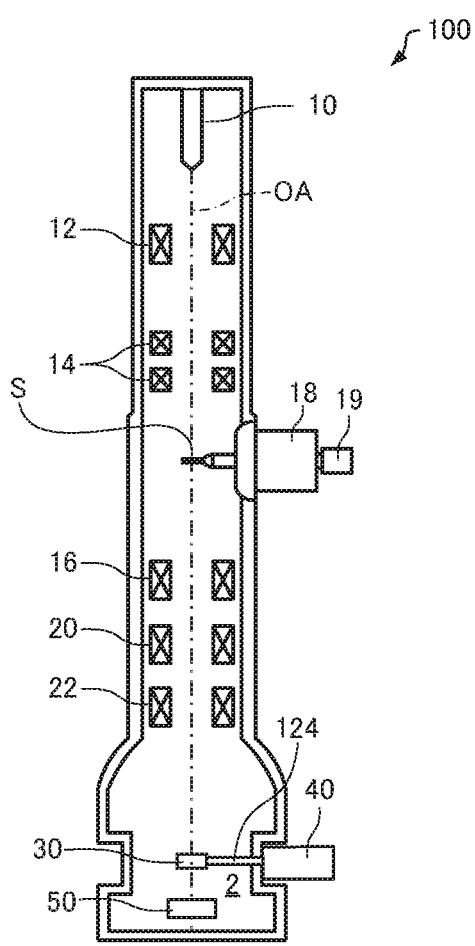
FIG. 1 is a diagram illustrating a configuration of an electron microscope according to an embodiment of the invention.

According to an embodiment of the invention, there is provided a charged particle beam device including:

a detection chamber flange which airtightly seals a detection chamber;

a detector which is provided in the detection chamber;

a detector holding stand which holds the detector;

a first shaft which is slidably inserted into a guide hole and connected to the detector holding stand, the guide hole being provided in the detection chamber flange;

a first flange which is attached to the detection chamber flange and has a spherical bearing;

a second flange which is supported by the spherical bearing of the first flange; and a second shaft which is slidably inserted into a guide hole provided in the second flange and passes through a through-hole in the detection chamber flange to be connected to the detector holding stand, each of the first shaft and the second shaft being provided with a flow channel of a heat transfer medium for cooling or heating the detector.

In such a charged particle beam device, for example, when the first shaft is considered a reference, coaxiality between the second shaft and a guide hole can be secured with the spherical bearing of the first flange even if the second shaft is inclined due to manufacturing error. Therefore, with such a charged particle beam device, manufacturing error can be absorbed.

According to an embodiment of the invention, there is provided a charged particle beam device including:

a detection chamber flange which airtightly seals a detection chamber;

a detector which is provided in the detection chamber;

a detector holding stand which holds the detector;

a first shaft which is slidably inserted into a guide hole and connected to the detector holding stand, the guide hole being provided in the detection chamber flange;

a linear motion shaft which has a spherical tip section;

a drive unit which linearly moves the linear motion shaft; and a shaft supporting member which is connected to the detector holding stand and has a spherical bearing for receiving the tip section of the linear motion shaft.

In such a charged particle beam device, for example, when the first shaft is considered a reference, since the tip section of the linear motion shaft is received by the spherical bearing of the shaft supporting member, the detector holding stand can be linearly moved in a predetermined direction even if the linear motion shaft is inclined due to manufacturing error. Therefore, with such a charged particle beam device, manufacturing error can be absorbed.

Preferred embodiments of the invention will be described in detail below with reference to the drawings. Note that the following embodiments do not unduly limit the scope of the invention as stated in the claims. In addition, all of the elements described in connection with the following embodiments should not necessarily be taken as essential requirements of the invention.

Furthermore, as a charged particle beam device according to an embodiment of the invention, an electron microscope which irradiates a specimen with an electron beam for observation and analysis of the specimen will be described below, but the charged particle beam device may irradiates a specimen with a charged particle beam (such as ions) other than an electron beam for observation and analysis of the specimen.

1. Electron Microscope

First, an electron microscope according to an embodiment of the invention will be described with reference to the drawings. FIG. 1 is a diagram illustrating a configuration of an electron microscope 100 according to an embodiment of the invention. In FIG. 1, respective members constituting the electron microscope 100 are illustrated in a simplified manner.

The electron microscope 100 is a scanning transmission electron microscope (STEM). In other words, the electron microscope 100 is a device capable of generating a scanning transmission electron microscope image (a STEM image) by scanning an electron beam over a specimen S and acquiring intensity information of an electron beam having passed through the specimen S for each irradiation position of the electron beam.

As illustrated in FIG. 1, the electron microscope 100 includes an electron source 10, a irradiation lens system 12, a scanning coil 14, an objective lens 16, a specimen stage 18, a specimen holder 19, an intermediate lens 20, a projector lens 22, a detector 30, a drive unit 40, and a detector 50.

The electron source 10 discharges an electron beam. The electron source 10 is, for example, an electron gun which accelerates electrons emitted from a cathode by an anode and which emits an electron beam.

The irradiation lens system 12 irradiates a specimen S with an electron beam emitted from the electron source 10. Although not illustrated, the irradiation lens system 12 may be constituted by a plurality of condenser lenses.

The scanning coil 14 causes an electron beam discharged from the electron source 10 to be deflected two-dimensionally. The scanning coil 14 is a coil used in order to scan a surface of the specimen S with an electron beam (an electron probe).

The objective lens 16 causes an electron beam to converge on the specimen S to form an electron probe. In addition, the objective lens 16 forms an image with an electron beam having passed through the specimen S.

The specimen stage 18 holds the specimen S. In the illustrated example, the specimen stage 18 holds the specimen S via the specimen holder 19. The specimen stage 18 is capable of moving the specimen S in horizontal and vertical directions.

The intermediate lens 20 and the projector lens 22 guide an electron beam having passed through the specimen S to the detector 30 and the detector 50.

The detector 30 is provided in a detection chamber 2. The detection chamber 2 is in a vacuum state. The detector 30 is a pixelated STEM detector capable of recording an electron diffraction pattern as a two-dimensional digital image. The pixelated STEM detector is a high-speed image sensor capable of two-dimensionally detecting an electron beam and acquiring a two-dimensional image and, at the same time, capable of tracking scanning of the electron beam.

In the electron microscope 100, an electron diffraction pattern formed on a back focal plane of the objective lens 16 is enlarged by the intermediate lens 20 and the projector lens 22 and transferred to a detector plane of the detector 30. Accordingly, the electron diffraction pattern can be acquired at the detector 30.

The drive unit 40 moves the detector 30 between a detection position and a retracted position. The drive unit 40 moves the detector 30 by moving a detector holding stand 110 via a linear motion shaft 124. For example, the drive unit 40 moves the detector holding stand 110 by linearly moving (in other words, moving in a linear manner) the linear motion shaft 124 by driving with an air cylinder utilizing a compressed gas. Alternatively, the drive unit 40 may move the detector holding stand 110 by linearly moving the linear motion shaft 124 by driving with a motor.

The detection position refers to a position where the detector 30 detects an electron beam transmitted through the specimen S. When the detector 30 is a pixelated STEM detector, the detection position is a position where a center of the detector plane of the detector 30 (a center of a sensor) is above an optical axis OA of an optical system of the electron microscope 100. The retracted position refers to a position where the detector 30 does not obstruct detection of an electron beam by the detector 50 and which is deviated from the optical axis OA.

The detector 50 is provided in a successive stage to the detector 30. For example, the detector 50 is provided on the optical axis OA and is capable of detecting an electron beam when the detector 30 is at the retracted position. The detector 50 is a detector which detects an electron beam having passed through the specimen S. For example, the detector 50 may be a detector for obtaining a bright-field STEM image, a detector for obtaining an image by annular bright-field scanning transmission electron microscopy (ABF-STEM), a detector for obtaining an image by low-angle annular dark-field scanning transmission electron microscopy (LAADF-STEM), or a detector for obtaining an image by high-angle annular dark-field scanning transmission electron microscopy (HAADF-STEM).

2. Detector and Drive Unit

Figure 2:
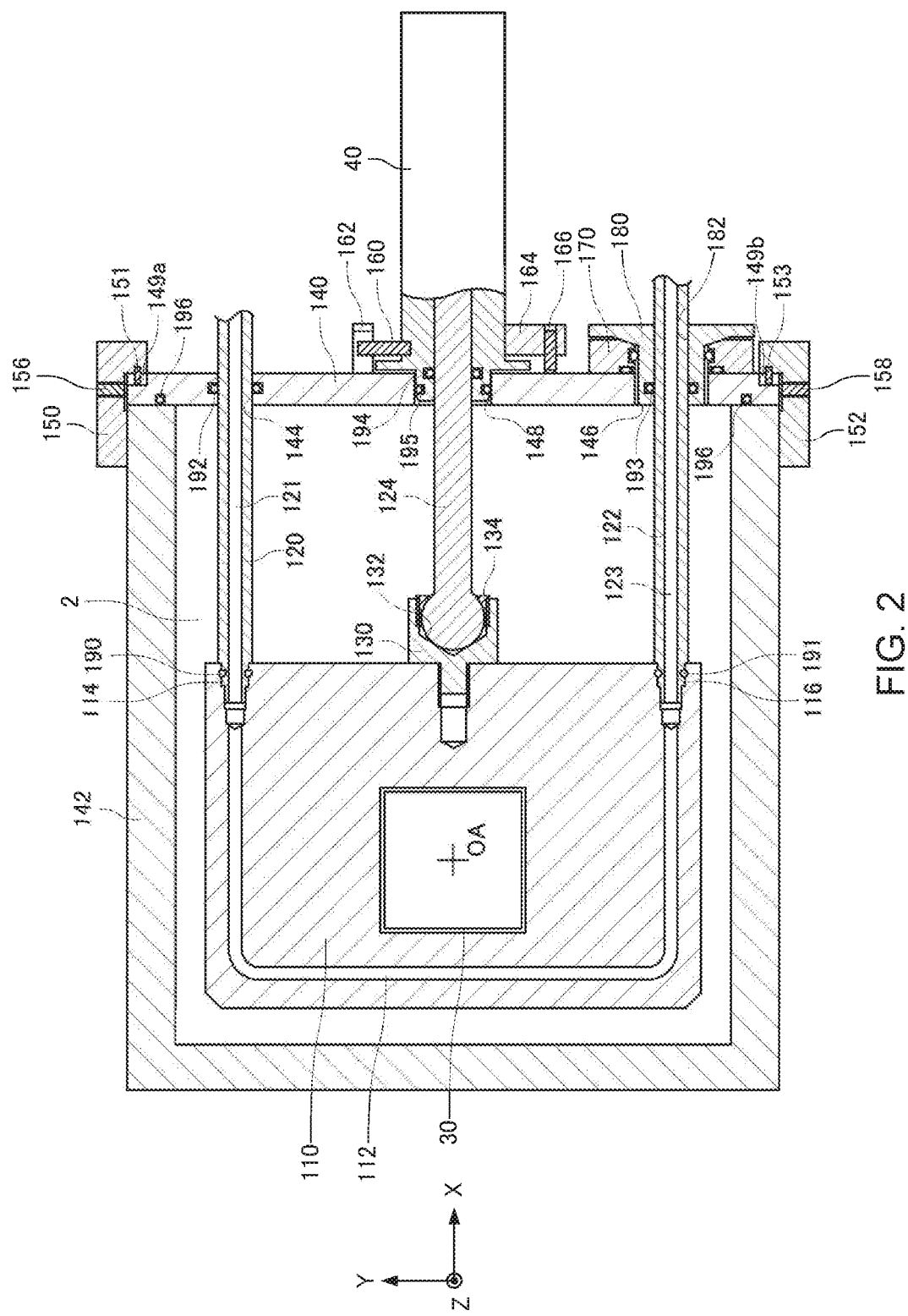
FIG. 2 is a diagram schematically illustrating a detector and a drive unit.
Figure 3:
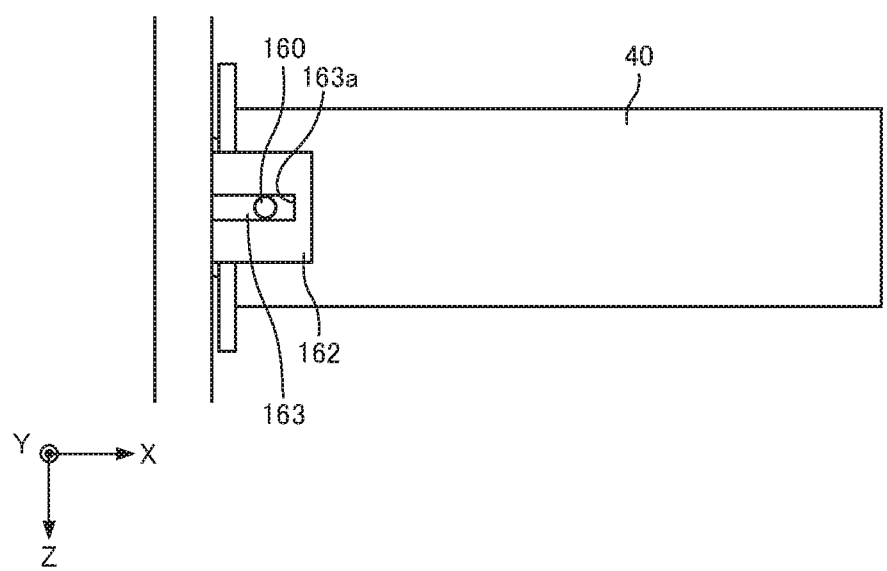
FIG. 3 is a partially-enlarged diagram schematically illustrating a detector and a drive unit.
Figure 4:
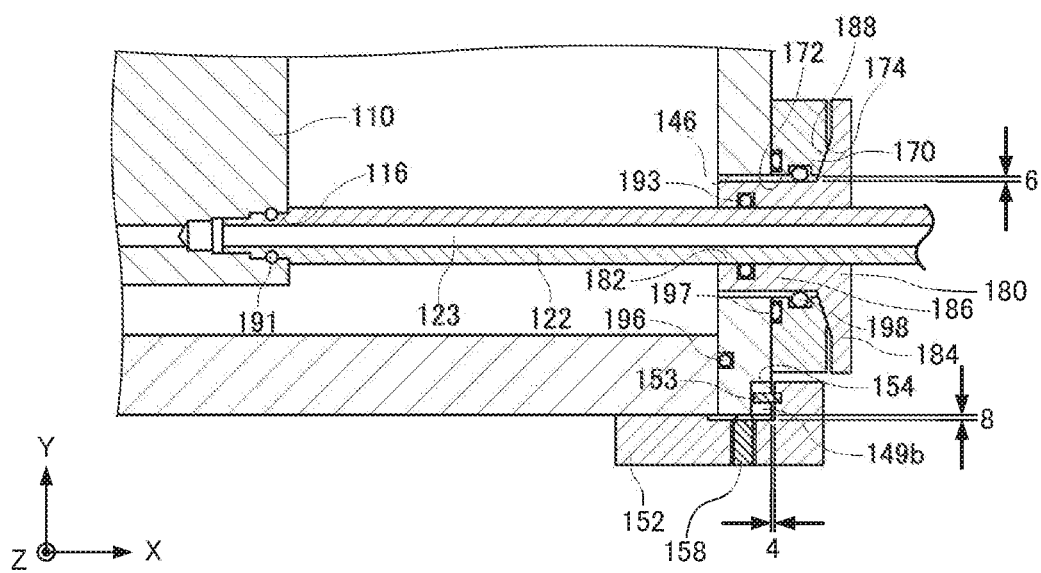
FIG. 4 is a partially-enlarged diagram schematically illustrating a detector and a drive unit.
Figure 5:
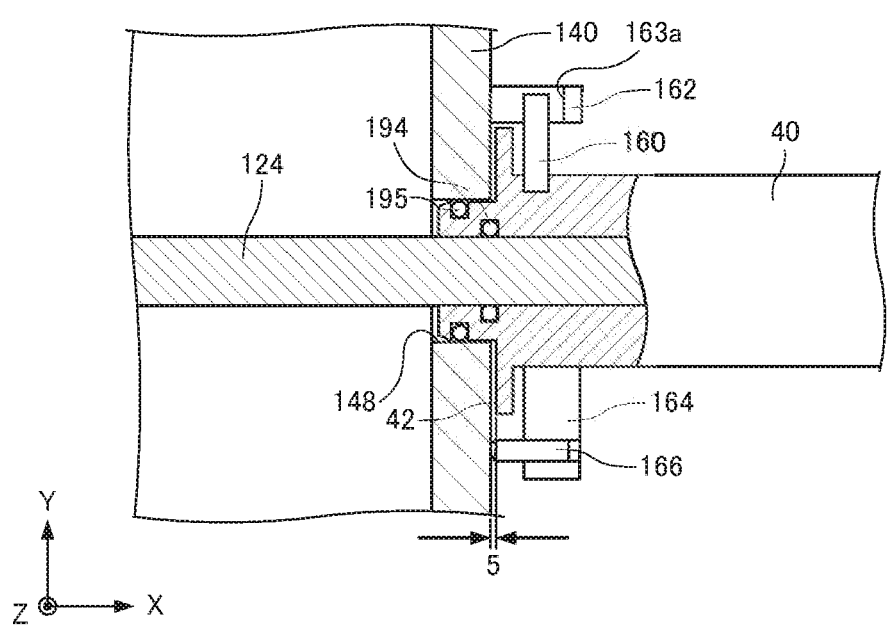
FIG. 5 is a partially-enlarged diagram schematically illustrating a detector and a drive unit.

Next, configurations of the detector 30 and the drive unit 40 will be described. FIG. 2 is a diagram schematically illustrating the detector 30 and the drive unit 40. FIGS. 3 to 5 are diagrams schematically illustrating parts of the detector 30 and the drive unit 40. FIGS. 2 to 5 illustrate a state where the detector 30 is at the detection position. Note that an X axis, a Y axis, and a Z axis are illustrated in FIGS. 2 to 5 as three mutually perpendicular axes. Also note that the Z axis is an axis parallel to the optical axis OA.

As illustrated in FIG. 2, the electron microscope 100 is configured to include the detector holding stand 110, a first shaft 120, a second shaft 122, the linear motion shaft 124, a shaft supporting member 130, a detection chamber flange 140, a wall member 142, flange supporting members 150 and 152, a pin 160, a guide member 162, a first flange 170, and a second flange 180.

The detector 30 is provided in the detection chamber 2. The detector 30 is fixed to and held by the detector holding stand 110.

The detector holding stand 110 is provided with a flow channel 112. Cooling water for cooling the detector 30 is allowed to flow through the flow channel 112. The first shaft 120 and the second shaft 122 are connected to the detector holding stand 110. The detector holding stand 110 is supported by the first shaft 120 and the second shaft 122.

The first shaft 120 is provided with a flow channel 121 for introducing the cooling water. The second shaft 122 is provided with a flow channel 123 for leading out the cooling water. The first shaft 120 and the second shaft 122 are equipped with a function for introducing or leading out cooling water to or from the detector holding stand 110 and a function for regulating rotation of the detector 30 when the detector 30 is linearly moved by the drive unit 40.

The first shaft 120 is connected to the detector holding stand 110. Specifically, a tip section of the first shaft 120 is inserted into and fixed by a hole section 114 provided in the detector holding stand 110. An O ring 190 is mounted to the tip section of the first shaft 120 and provides an airtight seal between the first shaft 120 and a surface that defines the hole section 114 of the detector holding stand 110.

The second shaft 122 is connected to the detector holding stand 110. Specifically, a tip section of the second shaft 122 is inserted into and fixed by a hole section 116 provided in the detector holding stand 110. An O ring 191 is mounted to the tip section of the second shaft 122 and provides an airtight seal between the second shaft 122 and a surface that defines the hole section 116 of the detector holding stand 110.

By connecting the first shaft 120 and the second shaft 122 to the detector holding stand 110, the flow channel 121, the flow channel 112, and the flow channel 123 are connected to each other. Accordingly, cooling water is introduced from the flow channel 121 to the flow channel 112 and led out from the flow channel 123.

The first shaft 120 is slidably inserted into a guide hole 144 provided in the detection chamber flange 140. A surface that defines the guide hole 144 of the detection chamber flange 140 is provided with a groove to which an O ring 192 is mounted. Due to the O ring 192, an airtight seal can be provided between the first shaft 120 and the detection chamber flange 140 and, at the same time, the first shaft 120 becomes slidable in the guide hole 144.

The second shaft 122 is slidably inserted into a guide hole 182 provided in the second flange 180. A surface that defines the guide hole 182 of the second flange 180 is provided with a groove to which an O ring 193 is mounted. Due to the O ring 193, an airtight seal can be provided between the second flange 180 and the second shaft 122 and, at the same time, the second shaft 122 becomes slidable in the guide hole 182.

The linear motion shaft 124 is connected to the drive unit 40. The linear motion shaft 124 linearly moves in an X direction due to an operation of the drive unit 40. The linear motion shaft 124 has an axis that is parallel to the X axis and moves in the direction of the axis due to an operation of the drive unit 40. The linear motion shaft 124 is guided so as to be linearly movable by a linear motion guide of the drive unit 40. A surface in contact with the linear motion shaft 124 of the drive unit 40 is provided with a groove to which an O ring 194 is mounted. Due to the O ring 194, an airtight seal can be provided between the drive unit 40 and the linear motion shaft 124 and, at the same time, the linear motion shaft 124 becomes slidable.

A tip section of the linear motion shaft 124 is a curved surface (for example, a part of a spherical surface). A shaft supporting member 130 provided with a spherical bearing 132 for receiving the tip section of the linear motion shaft 124 is attached to the detector holding stand 110. The tip section of the linear motion shaft 124 is fixed by being sandwiched between the spherical bearing 132 and a nut 134 of the shaft supporting member 130. Accordingly, the detector holding stand 110 can be linearly moved in the X direction without restricting an inclination of the linear motion shaft 124.

The drive unit 40 linearly moves the linear motion shaft 124. The drive unit 40 is attached to the detection chamber flange 140. A part of the drive unit 40 is inserted into a guide hole 148 of the detection chamber flange 140. By inserting the drive unit 40 into the guide hole 148, the drive unit 40 is attached to the detection chamber flange 140 so that the linear motion shaft 124 linearly moves in the X direction. An O ring 195 is mounted to a portion of the drive unit 40 inserted into the guide hole 148 and provides an airtight seal between the drive unit 40 and the detection chamber flange 140.

The detection chamber flange 140 is fixed to the wall member 142 which defines the detection chamber 2 by a screw (not shown) or the like. A surface in contact with the wall member 142 of the detection chamber flange 140 is provided with a groove to which an O ring 196 is mounted.

Due to the O ring 196, an airtight seal is provided between the detection chamber flange 140 and the wall member 142.

The detection chamber flange 140 is provided with the guide hole 144 into which the first shaft 120 is inserted, a through-hole 146 to which the second flange 180 is attached and through which the second shaft 122 passes, and the guide hole 148 through which the linear motion shaft 124 passes and to which the drive unit 40 is attached.

The first flange supporting member 150 and the second flange supporting member 152 are fixed to the wall member 142 by a screw (not shown) or the like. The first flange supporting member 150 and the second flange supporting member 152 are provided around the detection chamber flange 140. The first flange supporting member 150 and the second flange supporting member 152 are provided at positions that oppose each other across the detection chamber flange 140.

When positioning the detector 30 by creating a state where the detection chamber flange 140 is not fixed by loosening a screw for fixing the detection chamber flange 140 to the wall member 142 (refer to "3.2. Positioning in Y direction" to be described later), the first flange supporting member 150 and the second flange supporting member 152 function as stoppers for preventing leakage (vacuum leakage) from between the detection chamber flange 140 and the wall member 142 when the O ring 196 does not function.

Specifically, the first flange supporting member 150 and the second flange supporting member 152 restrict a distance between the detection chamber flange 140 and the wall member 142 in the X direction from exceeding a distance at which sealing by the O ring 196 provided between the detection chamber flange 140 and the wall member 142 is enabled.

As illustrated in FIG. 4, the second flange supporting member 152 has a surface 154 opposing an upper surface of the detection chamber flange 140 and movement of the detection chamber flange 140 in the X direction is restricted by the surface 154 of the second flange supporting member 152. A gap 4 is formed between the surface 154 of the second flange supporting member 152 and the upper surface of the detection chamber flange 140. The detection chamber flange 140 is only capable of moving in the X direction by a distance corresponding to a size of the gap 4. In other words, the distance between the detection chamber flange 140 and the wall member 142 represents a separation corresponding to the size of the gap 4. The gap 4 is set to a size which enables the detection chamber flange 140 to move in a Y direction and which enables sealing by the O ring 196. Therefore, using the second flange supporting member 152, the distance between the detection chamber flange 140 and the wall member 142 can be restricted from exceeding a distance at which sealing by the O ring 196 is enabled. Note that the first flange supporting member 150 is configured in a similar manner to the second flange supporting member 152.

A pin 151 is fixed to the first flange supporting member 150. The pin 151 is inserted into a guide hole 149a of the detection chamber flange 140. The guide hole 149a is an elongated hole having a longitudinal direction in the Y direction and guides the pin 151 in the Y direction.

In addition, a pin 153 is fixed to the second flange supporting member 152. The pin 153 is inserted into a guide hole 149b of the detection chamber flange 140. The guide hole 149b is an elongated hole having a longitudinal direction in the Y direction and guides the pin 153 in the Y direction.

A screw hole to which a Y-direction positioning screw 156 for performing positioning in the Y direction is to be screwed is formed in the first flange supporting member 150. In a similar manner, a screw hole to which a Y-direction positioning screw 158 for performing positioning in the Y direction is to be screwed is formed in the second flange supporting member 152. By tightening and loosening the Y-direction positioning screw 156 and the Y-direction positioning screw 158, the detector 30 can be positioned in the Y direction as will be described later in "3. 2. Positioning in Y direction".

The drive unit 40 is provided with a pin 160 which extends in the Y direction. A tip section of the pin 160 is inserted into a guide hole 163 of a guide member 162 provided in the detection chamber flange 140. Accordingly, the pin 160 is guided in the X direction. As a result, rotation of the drive unit 40 is restricted.

The drive unit 40 is provided with a block 164. The block 164 protrudes from the drive unit 40 in the Y direction. A screw hole to which an X-direction positioning screw 166 is to be screwed is formed in the block 164. By tightening and loosening the X-direction positioning screw 166, the detector 30 can be positioned in the X direction as will be described later in "3. 1. Positioning in X direction".

The first flange 170 is fixed to the detection chamber flange 140 by a screw (not shown) or the like. As illustrated in FIG. 4, the first flange 170 is provided with a through-hole 172 which is communicated with the through-hole 146 of the detection chamber flange 140. A spherical bearing 174 is provided on a surface of the first flange 170 on an opposite side to a surface on a side of the detection chamber flange 140.

A surface in contact with the detection chamber flange 140 of the first flange 170 is provided with a groove to which an O ring 197 is mounted. Due to the O ring 197, an airtight seal is provided between the first flange 170 and the detection chamber flange 140.

A surface that defines the through-hole 172 of the first flange 170 is provided with a groove to which an O ring 198 is mounted. Due to the O ring 198, an airtight seal is provided between the first flange 170 and the second flange 180.

The second flange 180 has: a first portion 184 provided above the first flange 170; and a second portion 186 extending from the first portion 184 and provided in the through-hole 172 and the through-hole 146. The second flange 180 is provided with a guide hole 182 into which the second shaft 122 is to be inserted.

The second flange 180 is supported by the spherical bearing 174. The second flange 180 has an abutting surface 188 which abuts against the spherical bearing 174. The abutting surface 188 of the second flange 180 is provided in the first portion 184.

Figure 6:
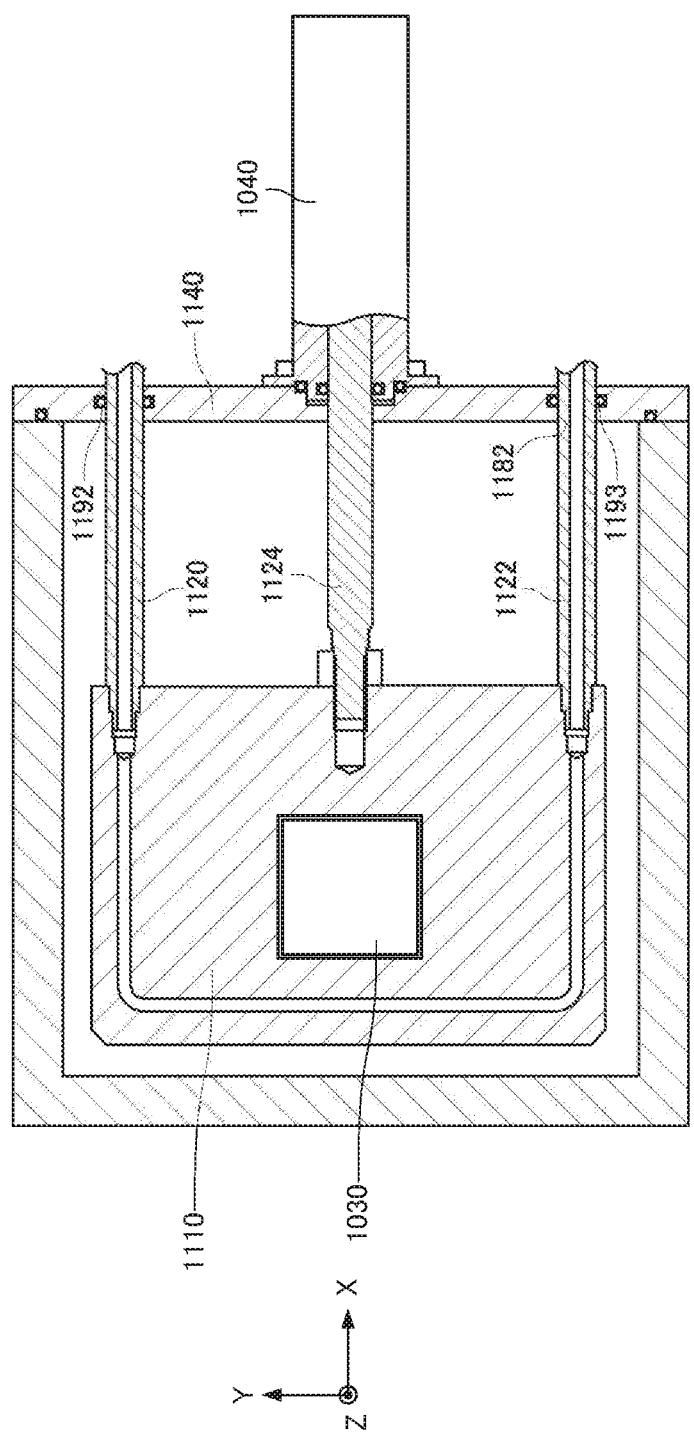
FIG. 6 is a diagram schematically illustrating a detector and a drive unit of an electron microscope according to a reference example.

FIG. 6 is a diagram illustrating configurations of a detector 1030 and a drive unit 1040 of an electron microscope according to a reference example. Hereinafter, advantageous effects produced by the electron microscope 100 will be described by comparing the electron microscope 100 with the configuration of the electron microscope according to the reference example illustrated in FIG. 6.

In the example illustrated in FIG. 6, when a first shaft 1120 is considered a reference axis, a second shaft 1122 may deviate from being parallel to the first shaft 1120 and become inclined due to manufacturing error.

The second shaft 1122 is slidably inserted into a guide hole 1182 of a detection chamber flange 1140. When the second shaft 1122 deviates from being parallel to the first shaft 1120 and becomes inclined due to manufacturing error, coaxiality between the second shaft 1122 and the guide hole 1182 can no longer be secured. Therefore, a load may be applied to an O ring 1193 which provides a seal between the second shaft 1122 and the detection chamber flange 1140 and leakage may occur.

In contrast, with the electron microscope 100, as illustrated in FIG. 4, since the second flange 180 is supported by the spherical bearing 174 of the first flange 170, coaxiality between the second shaft 122 and the guide hole 182 can be secured even when the second shaft 122 is inclined. In this manner, with the electron microscope 100, manufacturing error can be absorbed and airtightness of the detection chamber 2 can be secured.

In addition, with the electron microscope 100, although not illustrated, a through-hole (a drilled hole) through which a bolt for fixing the first flange 170 provided in the detection chamber flange 140 is to be passed is formed sufficiently larger than a diameter of the bolt. Therefore, the position of the first flange 170 in the Y direction can be adjusted. By adjusting the position of the first flange 170 in the Y direction, the position of the second flange 180 in the Y direction can be adjusted. Accordingly, a position of a center of rotation (a center of inclination) of the second shaft 122 can be adjusted and manufacturing error can be further absorbed. For example, in the example illustrated in FIG. 4, the second flange 180 can be adjusted in the Y direction by a distance corresponding to a size of a gap 6 between the detection chamber flange 140 and the second flange 180.

3. Positioning

Next, a positioning method of the detector 30 in the electron microscope 100 will be described. Hereinafter, a method of positioning a detection position of the detector 30 will be described.

When the detector 30 is a pixelated STEM detector, a center of the detector 30 is desirably aligned with the optical axis OA while checking an image of an electron beam. In order to position the detector 30 while checking an image of an electron beam, the positioning of the detector 30 must be performed in a state where vacuum of the detection chamber 2 is maintained. As will be described later, with the electron microscope 100, positioning of the detector 30 in the X direction and positioning of the detector 30 in the Y direction can be performed in a state where vacuum of the detection chamber 2 is maintained.

3.1. Positioning in X Direction

In the electron microscope 100, positioning of the detector 30 in the X direction is performed by adjusting a position of the drive unit 40 in the X direction.

The position of the drive unit 40 in the X direction can be adjusted using the X-direction positioning screw 166. Adjusting the position of the drive unit 40 in the X direction using the X-direction positioning screw 166 enables the detector 30 to be positioned in the X direction. Accordingly, positioning of the detector 30 in the X direction can be performed while maintaining vacuum of the detection chamber 2.

As illustrated in FIG. 5, a gap 5 is present between an installation surface 42 of the drive unit 40 and the detection chamber flange 140. Therefore, the drive unit 40 is movable in a −X direction by a distance corresponding to a size of the gap 5.

In addition, the drive unit 40 is movable in a +X direction until the pin 160 abuts against an end surface 163a (refer to FIG. 3) of the guide hole 163. A length of the guide hole 163 is set to a length that prevents the O ring 195 from detaching from the guide hole 148.

3.2. Positioning in Y Direction

In the electron microscope 100, positioning of the detector 30 in the Y direction is performed by adjusting a position of the detection chamber flange 140 in the Y direction.

Specifically, first, a screw or the like (not shown) which fixes the detection chamber flange 140 and the wall member 142 to each other is loosened to create a state where the detection chamber flange 140 is not fixed. At this point, the first flange supporting member 150 and the second flange supporting member 152 function as stoppers of the detection chamber flange 140 and prevent leakage from between the detection chamber flange 140 and the wall member 142 when the O ring 196 does not function.

The pin 151 is inserted into the guide hole 149a of the detection chamber flange 140. In addition, the pin 153 is inserted into the guide hole 149b of the detection chamber flange 140. Therefore, the detection chamber flange 140 does not fall off even if the screw or the like which fixes the detection chamber flange 140 and the wall member 142 to each other is loosened. Furthermore, the detection chamber flange 140 can be restricted from moving in a direction other than the Y direction.

Next, in a state where the detection chamber flange 140 is not fixed, by tightening and loosening the Y-direction positioning screw 156 and the Y-direction positioning screw 158, the position of the detection chamber flange 140 in the Y direction is adjusted and the position of the detector 30 in the Y direction is adjusted. Accordingly, positioning of the detector 30 in the Y direction can be performed while maintaining vacuum of the detection chamber 2.

As illustrated in FIG. 4, a gap 8 is present between the detection chamber flange 140 and the second flange supporting member 152 in the Y direction. Therefore, the detection chamber flange 140 is movable in a −Y direction by a distance corresponding to a size of the gap 8. In a similar manner, a gap is present between the detection chamber flange 140 and the first flange supporting member 150 in the Y direction. Therefore, the detection chamber flange 140 is movable in a +Y direction by a distance corresponding to a size of the gap.

4. Operations of Electron Microscope

Figure 7:
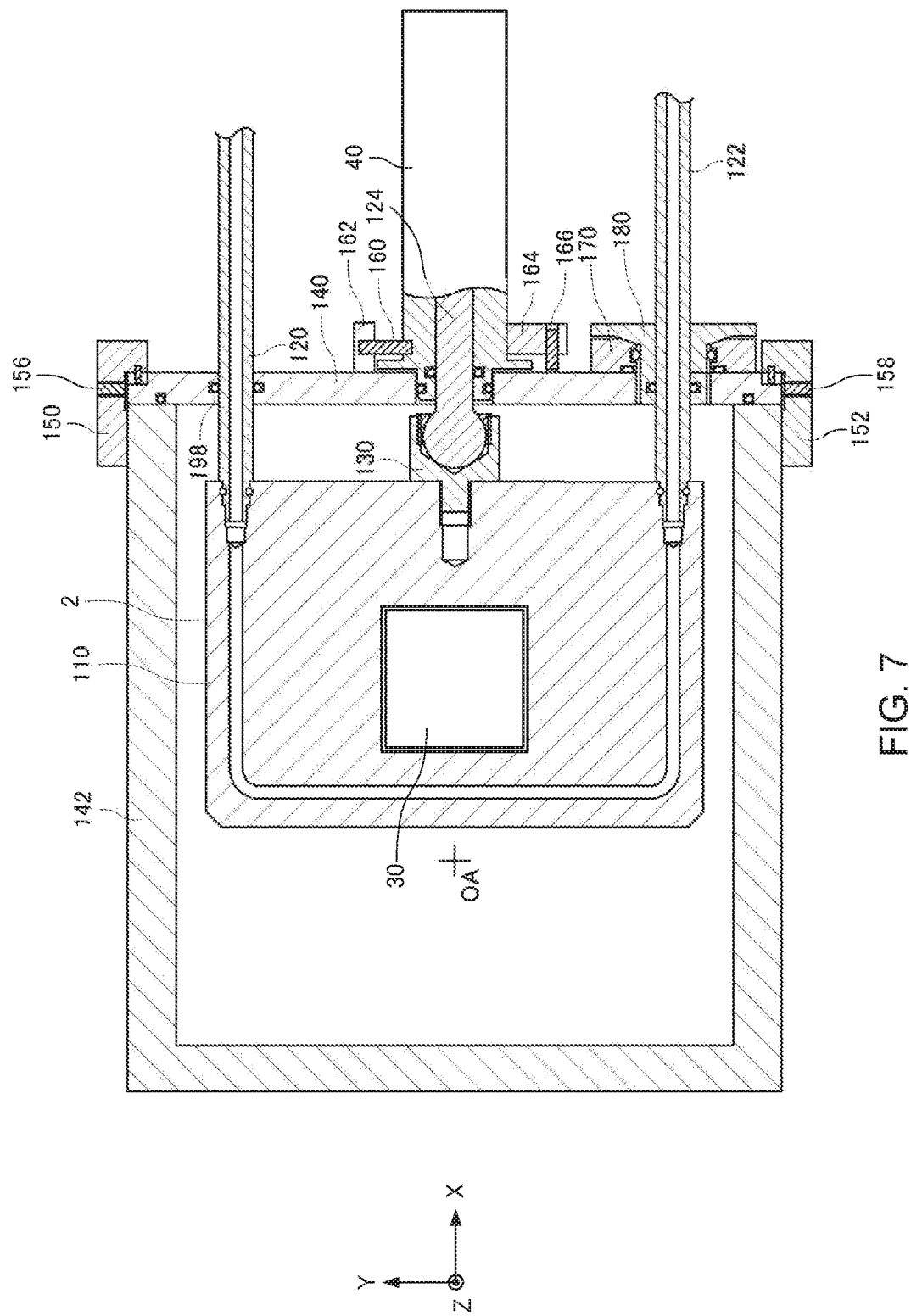
FIG. 7 is a diagram schematically illustrating a detector and a drive unit.

Next, operations of the electron microscope 100 will be described. Operations of the drive unit 40 will be described below. FIG. 7 is a diagram schematically illustrating the detector 30 and the drive unit 40. FIG. 7 illustrates a state where the detector 30 is at the retracted position.

As illustrated in FIG. 2, when the drive unit 40 moves the linear motion shaft 124 in the −X direction, the detector 30 moves to the detection position. In addition, as illustrated in FIG. 5, when the drive unit 40 moves the linear motion shaft 124 in the +X direction, the detector 30 moves to the retracted position.

In this case, when the first shaft 120 is considered a reference axis, the linear motion shaft 124 may deviate from being parallel to the first shaft 120 and become inclined due to manufacturing error.

For example, in the example illustrated in FIG. 6, a tip of a linear motion shaft 1124 is directly fixed to a detector holding stand 1110. In this case, when the linear motion shaft 1124 deviates from being parallel to the first shaft 1120 and becomes inclined due to manufacturing error, for example, there is a possibility that the detector holding stand 1110 cannot be accurately linearly moved in the X direction and the detector holding stand 1110 may linearly move in a direction deviated from the X direction. In addition, for example, when linearly moving the detector holding stand 1110 in the X direction with the linear motion shaft 1124, there is a possibility that a load may be applied to an O ring 1192 which provides a seal between the first shaft 1120 and the detection chamber flange 1140 and leakage may occur.

In contrast, with the electron microscope 100, when the first shaft 120 is considered a reference, since the tip section of the linear motion shaft 124 is received by the spherical bearing 132 of the shaft supporting member 130, the detector holding stand 110 (the detector 30) can be linearly moved in the X direction even if the linear motion shaft 124 is inclined due to manufacturing error. In this manner, with the electron microscope 100, manufacturing error can be absorbed and stable operations can be realized.

5. Features

For example, the electron microscope 100 has the following features.

The electron microscope 100 includes: a detection chamber flange 140 which airtightly seals a detection chamber 2; a detector 30 which is provided in the detection chamber 2; a detector holding stand 110 which holds the detector 30; a first shaft 120 which is slidably inserted into a guide hole 144 and connected to the detector holding stand 110, the guide hole being provided in the detection chamber flange 140; a first flange 170 which is attached to the detection chamber flange 140 and has a spherical bearing 174; a second flange 180 which is supported by the spherical bearing 174 of the first flange 170; and a second shaft 122 which is slidably inserted into a guide hole 182 provided in the second flange 180 and passes through a through-hole 146 in the detection chamber flange 140 to be connected to the detector holding stand 110, wherein each of the first shaft 120 and the second shaft 122 are provided with flow channels 121 and 123 of cooling water for cooling the detector 30.

Therefore, in the electron microscope 100, for example, when the first shaft 120 is considered a reference, coaxiality between the second shaft 122 and the guide hole 182 can be secured with the spherical bearing 174 of the first flange 170 even if the second shaft 122 is inclined due to manufacturing error. In this manner, with the electron microscope 100, manufacturing error can be absorbed.

The electron microscope 100 includes a linear motion shaft 124 of which a tip section is a curved surface, a drive unit 40 which moves the linear motion shaft 124, and a shaft supporting member 130 which is connected to the detector holding stand 110 and which is provided with a spherical bearing 132 for receiving the tip section of the linear motion shaft 124. Therefore, with the electron microscope 100, for example, when the first shaft 120 is considered a reference, since the tip section of the linear motion shaft 124 is received by the spherical bearing 132 of the shaft supporting member 130, the detector holding stand 110 can be linearly moved in the X direction even if the linear motion shaft 124 is inclined due to manufacturing error. In this manner, with the electron microscope 100, manufacturing error can be absorbed and stable operations can be realized.

The electron microscope 100 includes an O ring 196 provided between the detection chamber flange 140 and a wall member 142 which defines the detection chamber 2, and flange supporting members 150 and 152 which restrict a distance between the detection chamber flange 140 and the wall member 142 from exceeding a distance at which sealing by the O ring 196 is enabled. Therefore, with the electron microscope 100, even in a state where a screw or the like (not shown) fixing the detection chamber flange 140 and the wall member 142 to each other is loosened, the flange supporting members 150 and 152 become stoppers of the detection chamber flange 140 and prevent leakage from between the detection chamber flange 140 and the wall member 142 when the O ring 196 does not function. As a result, with the electron microscope 100, positioning of the detector 30 in the Y direction can be performed by moving the detection chamber flange 140 and a position of the detector 30 can be readily determined.

The invention is not limited to the embodiments described above, and various modifications can be made within the scope of the invention.

In the above embodiments, flow channels 112, 121, and 123 of cooling water for cooling the detector 30 are provided in the detector holding stand 110, the first shaft 120, and the second shaft 122, but the flow channels 112, 121, and 123 are not limited to flow channels of cooling water and may be flow channels of a heat transfer medium for cooling or heating the detector 30. For example, the detector 30 can be heated by causing a medium (for example, hot water) for heating the detector 30 to flow through the flow channels 112, 121, and 123.

In addition, the detector 30 is a pixelated STEM detector in the embodiments above, but the detector 30 may be any of other detectors. For example, the detector 30 may be a detector mounted with a charge coupled device (CCD) image sensor which requires cooling in order to reduce the effect of thermal noise. Furthermore, for example, the detector 30 may be an X-ray detector which detects X-rays.

The above embodiments of the charged particle beam device according to the invention is a scanning transmission electron microscope (STEM), but the charged particle beam device according to the invention is not limited thereto. In addition to the above, the charged particle beam device according to the invention may be a transmission electron microscope, a scanning electron microscope, a focused ion-beam milling observation device, etc.

The above embodiments are merely examples and the invention is not limited thereto. For example, the embodiments may be combined as appropriate.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam device comprising:
   a detection chamber flange which airtightly seals a detection chamber;
   a detector which is provided in the detection chamber;
   a detector holding stand which holds the detector;
   a first shaft which is slidably inserted into a first guide hole and connected to the detector holding stand, the first guide hole being provided in the detection chamber flange;

a first flange which is attached to the detection chamber flange and has a spherical bearing;

a second flange which is supported by the spherical bearing of the first flange; and a second shaft which is slidably inserted into a second guide hole provided in the second flange and passes through a through-hole provided in the detection chamber flange to be connected to the detector holding stand, each of the first shaft and the second shaft being provided with a flow channel of a heat transfer medium for cooling or heating the detector.

2. The charged particle beam device according to claim 1, further comprising:

a linear motion shaft which has a spherical tip section;

a drive unit which linearly moves the linear motion shaft; and a shaft supporting member which is connected to the detector holding stand and which has a spherical bearing for receiving the tip section of the linear motion shaft.

3. The charged particle beam device according to claim 1, further comprising:

an O ring which is provided between the detection chamber flange and a wall member that defines the detection chamber; and a flange supporting member which restricts a distance between the detection chamber flange and the wall member from exceeding a distance at which sealing by the O ring is enabled.

4. A charged particle beam device comprising:

a detection chamber flange which airtightly seals a detection chamber;

a detector which is provided in the detection chamber;

a detector holding stand which holds the detector;

a first shaft which is slidably inserted into a guide hole and connected to the detector holding stand, the guide hole being provided in the detection chamber flange;

a linear motion shaft which has a spherical tip section;

a drive unit which linearly moves the linear motion shaft; and a shaft supporting member which is connected to the detector holding stand and has a spherical bearing for receiving the tip section of the linear motion shaft.

\* \* \* \* \*